(12) United States Patent
Toya et al.

(10) Patent No.: US 10,818,810 B2
(45) Date of Patent: Oct. 27, 2020

(54) CONCENTRATOR PHOTOVOLTAIC MODULE, CONCENTRATOR PHOTOVOLTAIC DEVICE, AND HYDROGEN GENERATING SYSTEM

(71) Applicant: Sumitomo Electric Industries, Ltd., Osaka-shi (JP)

(72) Inventors: Kazumasa Toya, Osaka (JP); Makoto Inagaki, Osaka (JP); Youichi Nagai, Osaka (JP); Takashi Iwasaki, Osaka (JP); Kenji Saito, Osaka (JP); Rui Mikami, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/314,059

(22) PCT Filed: Jun. 7, 2017

(86) PCT No.: PCT/JP2017/021063
§ 371 (c)(1),
(2) Date: Dec. 28, 2018

(87) PCT Pub. No.: WO2018/008322
PCT Pub. Date: Jan. 11, 2018

(65) Prior Publication Data
US 2019/0237605 A1   Aug. 1, 2019

(30) Foreign Application Priority Data
Jul. 7, 2016 (JP) .................. 2016-134836

(51) Int. Cl.
*H02N 6/00* (2006.01)
*H01L 31/042* (2014.01)
(Continued)

(52) U.S. Cl.
CPC .......... *H01L 31/0543* (2014.12); *H01L 31/05* (2013.01); *H01L 31/0504* (2013.01);
(Continued)

(58) Field of Classification Search
CPC ........................ H01L 31/0543; H01L 31/05
(Continued)

(56) References Cited

U.S. PATENT DOCUMENTS

2007/0181175 A1* 8/2007 Landis .................. H01L 27/142
136/252
2009/0183762 A1* 7/2009 Jackson ............ H01L 31/02021
136/246

(Continued)

FOREIGN PATENT DOCUMENTS

JP        10-051020 A    2/1998
JP        2007-524762 A  8/2007
(Continued)

*Primary Examiner* — Angelo Trivisonno
(74) *Attorney, Agent, or Firm* — Baker Botts L.L.P.; Michael A. Sartori

(57) ABSTRACT

A concentrator photovoltaic module according to one embodiment of the present disclosure includes: a case; a substrate disposed on a bottom surface of the case and having a plurality of stacked wiring layers; and concentrator photovoltaic elements disposed on the substrate and connected to the wiring layers. The concentrator photovoltaic elements connected to different wiring layers are connected to each other in parallel. According to the concentrator photovoltaic module according to the one embodiment of the present disclosure, output voltage can be decreased.

7 Claims, 13 Drawing Sheets

(51) Int. Cl.
*H01L 31/054* (2014.01)
*H02S 10/00* (2014.01)
*H02S 40/22* (2014.01)
*H01L 31/05* (2014.01)

(52) U.S. Cl.
CPC .............. *H02S 10/00* (2013.01); *H02S 40/22* (2014.12); *Y02E 10/52* (2013.01)

(58) Field of Classification Search
USPC ......................................................... 136/246
See application file for complete search history.

(56) References Cited

U.S. PATENT DOCUMENTS

| | | | |
|---|---|---|---|
| 2010/0326492 A1 | 12/2010 | Tan et al. | |
| 2011/0155583 A1* | 6/2011 | Li | C25B 1/04 205/637 |
| 2017/0213928 A1 | 7/2017 | Toya et al. | |

FOREIGN PATENT DOCUMENTS

| | | |
|---|---|---|
| JP | 2011-060992 A | 3/2011 |
| JP | 2012-094684 A | 5/2012 |
| JP | 2013-152862 A | 8/2013 |
| JP | 2013-153076 A | 8/2013 |
| JP | 2013-161867 A | 8/2013 |
| JP | 2015-113516 A | 6/2015 |
| WO | 2005/080639 A1 | 9/2005 |
| WO | 2014037722 A1 | 3/2014 |
| WO | 2016/006573 A1 | 1/2016 |

* cited by examiner

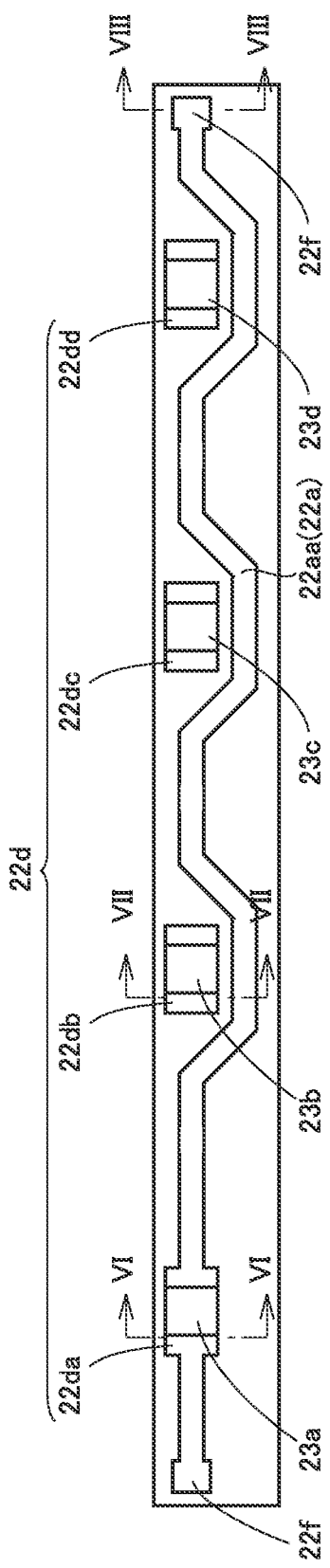

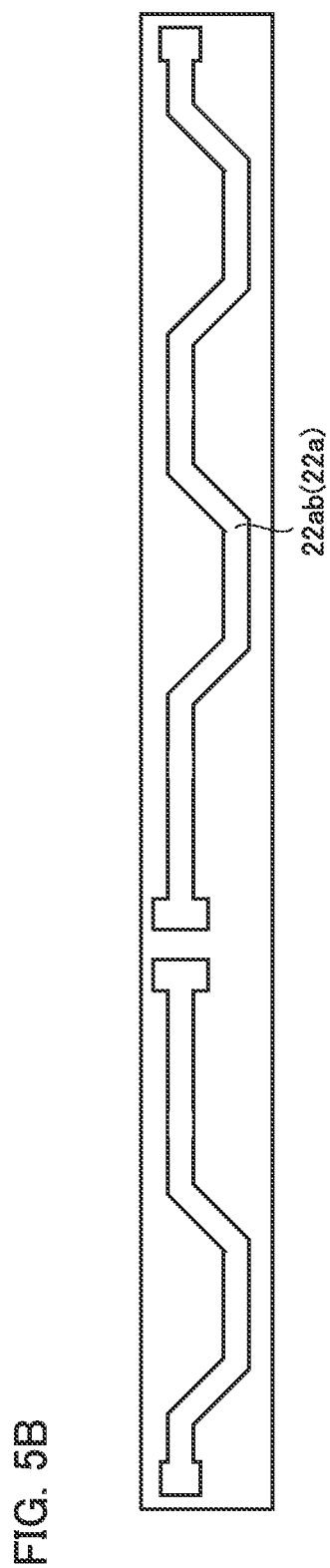

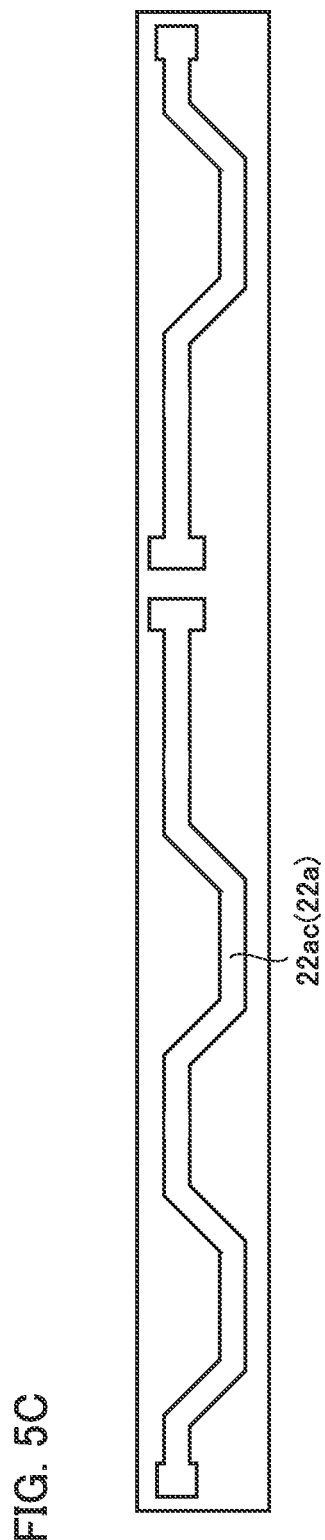

CONCENTRATOR PHOTOVOLTAIC MODULE, CONCENTRATOR PHOTOVOLTAIC DEVICE, AND HYDROGEN GENERATING SYSTEM

TECHNICAL FIELD

The present disclosure relates to a concentrator photovoltaic module, a concentrator photovoltaic device, and a hydrogen generating system. The present application claims a priority based on Japanese Patent Application No. 2016-134836 filed on Jul. 7, 2016, the entire content of which is incorporated herein by reference.

BACKGROUND ART

A concentrator photovoltaic module described in WO 2016/006573 (Patent Literature 1) includes: a case; FPC (Flexible Printed Circuit) substrates disposed on a bottom surface of the case; and a plurality of concentrator photovoltaic elements disposed on each FPC substrate. In the concentrator photovoltaic module described in Patent Literature 1, the FPC substrates are connected in series, and the plurality of concentrator photovoltaic elements on each FPC substrate are connected in series.

For example, Japanese Patent Laying-Open No. 2012-94684 (Patent Literature 2) discloses a hydrogen generating system having a concentrator photovoltaic device and a hydrogen generating device. In the hydrogen generating system described in Patent Literature 2, the hydrogen generating device is configured to electrolyze water using electric power supplied from the concentrator photovoltaic device, thereby generating hydrogen.

CITATION LIST

Patent Literature

PTL 1: WO 2016/006573
PTL 2: Japanese Patent Laying-Open No. 2012-94684

SUMMARY OF INVENTION

A concentrator photovoltaic module according to one embodiment of the present disclosure includes: a case; a substrate disposed on a bottom surface of the case and having a plurality of stacked wiring layers; and concentrator photovoltaic elements disposed on the substrate and connected to the wiring layers. The concentrator photovoltaic elements connected to different wiring layers are connected to each other in parallel.

BRIEF DESCRIPTION OF DRAWINGS

FIG. 5A is an enlarged top view of a substrate 22 of concentrator photovoltaic module 2 according to the embodiment.

FIG. 5B is an enlarged top view in a second layer of substrate 22 of concentrator photovoltaic module 2 according to the embodiment from the uppermost layer thereof.

FIG. 5C is an enlarged top view in a third layer of substrate 22 of concentrator photovoltaic module 2 according to the embodiment from the uppermost layer thereof.

DETAILED DESCRIPTION

Figure 1:
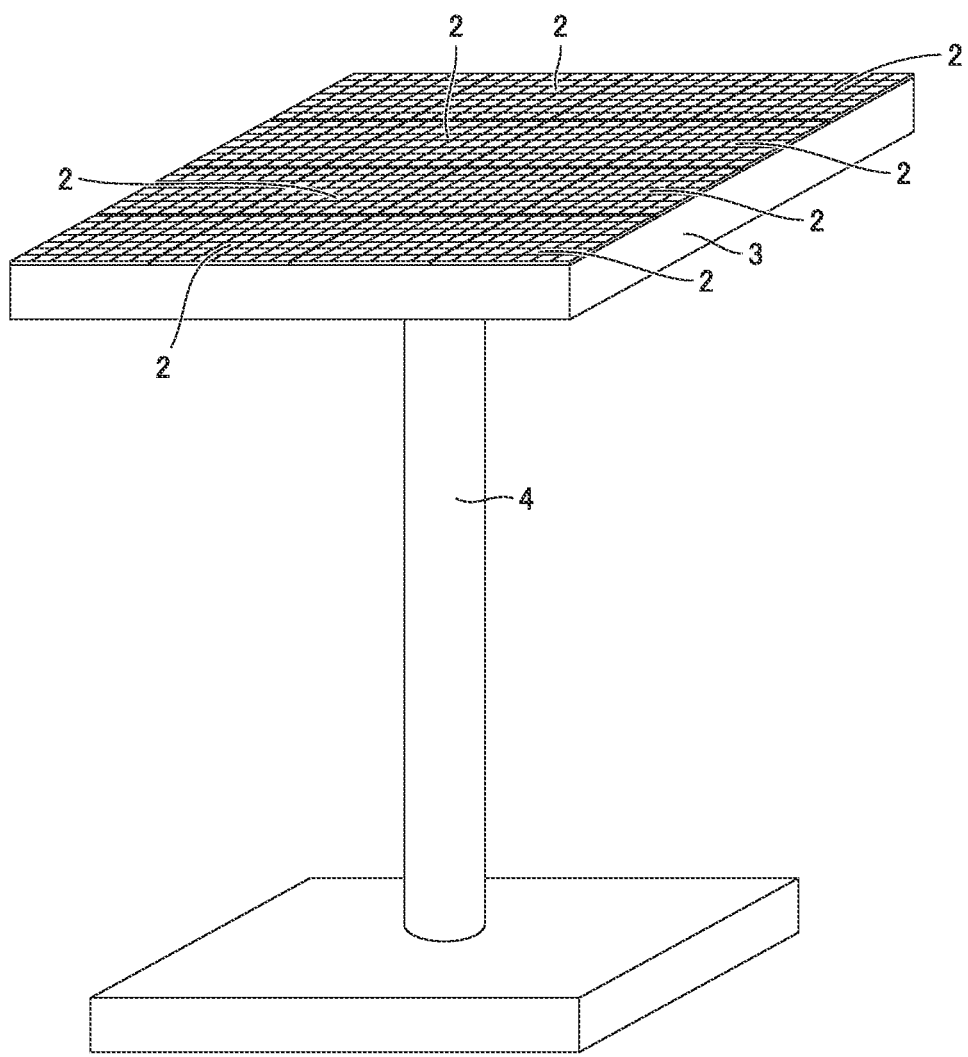
FIG. 1 is a perspective view of a concentrator photovoltaic device 1 according to an embodiment.

Problem to be Solved by the Present Disclosure

In the concentrator photovoltaic module described in Patent Literature 1, the plurality of concentrator photovoltaic elements are connected in series as described above. Hence, voltage output from the concentrator photovoltaic module is generally more than or equal to 50 V. In order to electrolyze water in the hydrogen generating device to generate hydrogen, supply of voltage of about 1.7 V is sufficient. If voltage higher than this is supplied, there will be a loss. Thus, the voltage output from the concentrator photovoltaic device may be preferably low.

Advantageous Effect of the Present Disclosure

According to the description above, output voltage from a concentrator photovoltaic module can be decreased.

Description of Embodiments

First, embodiments of the present disclosure are listed and described.

Hereinafter, details of the embodiments of the present disclosure will be described with reference to the figures. It should be noted that the same or corresponding portions in the figures are given the same reference characters. Moreover, at least a part of the embodiments described below may be appropriately combined.

(1) A concentrator photovoltaic module according to one embodiment includes: a case; a substrate disposed on a bottom surface of the case and having a plurality of stacked wiring layers; and concentrator photovoltaic elements disposed on the substrate and connected to the wiring layers. The concentrator photovoltaic elements connected to different wiring layers are connected to each other in parallel.

According to the concentrator photovoltaic module according to (1), output voltage can be decreased while suppressing increase of wiring resistance without limiting the degree of freedom in wiring design.

(2) The concentrator photovoltaic module according to (1) may further include a reverse current preventing unit connected to each of the concentrator photovoltaic elements in series, wherein the reverse current preventing unit may be configured to permit passage of current in a direction from the concentrator photovoltaic element toward the reverse current preventing unit, and may be configured to block current in a direction from the reverse current preventing unit toward the concentrator photovoltaic element.

According to the concentrator photovoltaic module according to (2), the output voltage can be decreased while preventing occurrence of reverse current.

(3) In the concentrator photovoltaic module according to (1) or (2), the concentrator photovoltaic elements connected to the same wiring layer may be connected to each other in series.

According to the concentrator photovoltaic module according to (3), the output voltage can be adjusted, whereby the output voltage can be optimized in accordance with a requirement specification of a device connected to the concentrator photovoltaic device.

(4) In the concentrator photovoltaic module according to any one of (1) to (3), the substrate may have an end-portion through-hole conductor disposed at an end portion of the substrate and connected to the plurality of wiring layers.

According to the concentrator photovoltaic module according to (4), a cross-sectional area of the wiring is increased at a portion at which the plurality of wiring layers are connected to each other, thereby suppressing a problem of generation of heat caused by flow of a large amount of current.

(5) In the concentrator photovoltaic module according to any one of (1) to (4), a plurality of the substrates may be provided, and the plurality of the substrates may be connected to each other in parallel.

According to the concentrator photovoltaic module according to (5), the output voltage can be decreased even when a larger number of concentrator photovoltaic elements are mounted.

(6) A concentrator photovoltaic device according to one embodiment includes the concentrator photovoltaic module recited in any one of (1) to (5). According to the concentrator photovoltaic device according to (6), the same effects as those in (1) to (5) are exhibited.

(7) A hydrogen generating system according to one embodiment may include: the concentrator photovoltaic device recited in (6); and a plurality of hydrogen generating devices connected to the concentrator photovoltaic device in series, wherein a ratio of voltage decreased by the plurality of hydrogen generating devices to output voltage of the concentrator photovoltaic device may be more than or equal to 80%.

According to the hydrogen generating system according to (7), electric power generated in the concentrator photovoltaic device can be suppressed from being lost.

Details of Embodiments of the Present Disclosure

Hereinafter, details of the embodiments of the present disclosure will be described with reference to figures. It should be noted that the same or corresponding portions in the figures are given the same reference characters. Moreover, at least a part of the embodiments described below may be appropriately combined.

Configuration of Concentrator Photovoltaic Device According to Embodiment

The following describes a configuration of a concentrator photovoltaic device 1 according to the embodiment.

FIG. 1 is a perspective view of concentrator photovoltaic device 1 according to the embodiment. As shown in FIG. 1, concentrator photovoltaic device 1 according to the embodiment has a concentrator photovoltaic module 2. Moreover, concentrator photovoltaic device 1 has a frame 3, a platform 4, a solar azimuth indicator (not shown), a controller (not shown), and a driver (not shown).

Concentrator photovoltaic module 2 is disposed on frame 3. A plurality of such concentrator photovoltaic modules 2 are preferably provided. On the frame, concentrator photovoltaic modules 2 are preferably arranged in the form of a matrix. Details of the configuration of each of the concentrator photovoltaic modules will be described later.

Frame 3 is attached on platform 4 with the driver being interposed therebetween. The driver includes, for example, a driving source such as a motor, and changes a direction in which frame 3 faces. The solar azimuth indicator is attached to frame 3, for example. The solar azimuth indicator detects a direction of the sun, and outputs, to the controller, a signal indicating the direction of the sun. Based on the signal from the solar azimuth indicator, the controller controls the driver such that the light receiving surface of concentrator photovoltaic module 2 faces in the direction of the sun.

Configuration of Concentrator Photovoltaic Module According to Embodiment

The following describes a configuration of the concentrator photovoltaic module.

Figure 2:
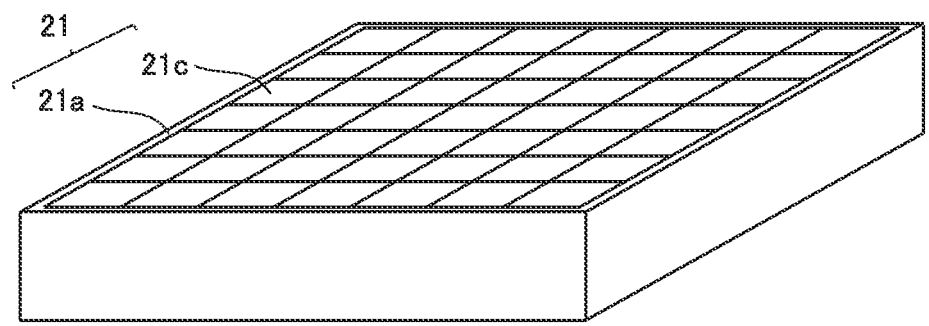
FIG. 2 is a perspective view of a concentrator photovoltaic module 2 according to the embodiment.

FIG. 2 is a perspective view of concentrator photovoltaic module 2 according to the embodiment. As shown in FIG. 2, concentrator photovoltaic module 2 according to the embodiment has a case 21. Case 21 has a frame body 21a, a bottom plate 21b (see FIG. 3), and a top plate 21c. Frame body 21a constitutes side walls of concentrator photovoltaic module 2. Bottom plate 21b constitutes a bottom surface of the concentrator photovoltaic module. Top plate 21c constitutes a top surface of concentrator photovoltaic module 2.

Figure 3:
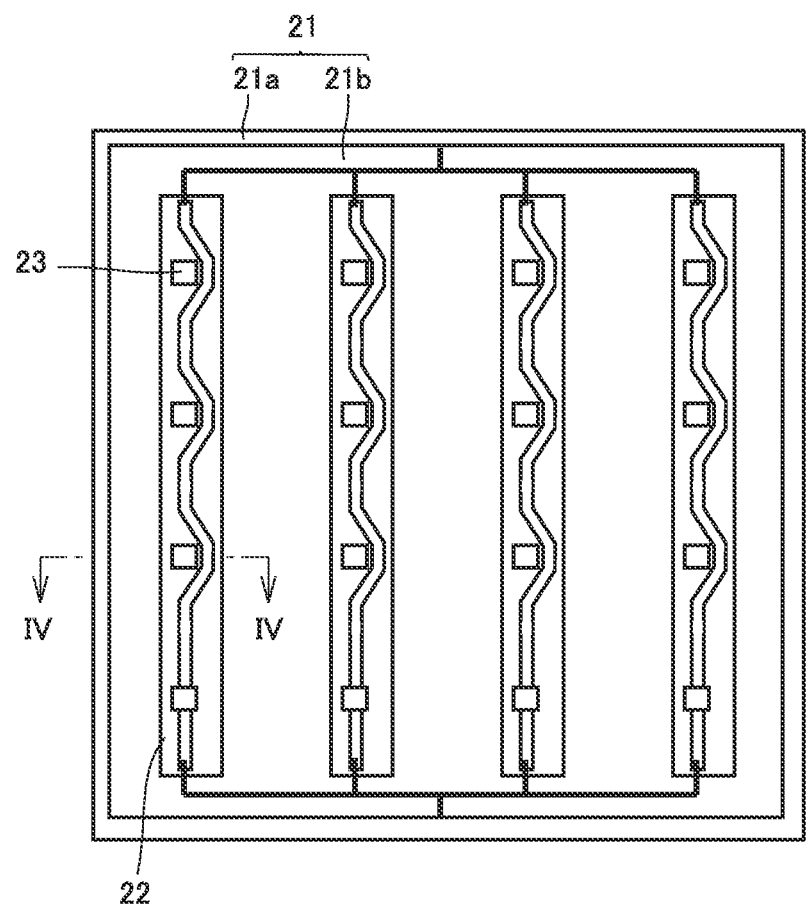
FIG. 3 is a top view of concentrator photovoltaic module 2 according to the embodiment.

FIG. 3 is a top view of concentrator photovoltaic module 2 according to the embodiment. In FIG. 3, illustration of top plate 21c is omitted in order to clarify an internal structure of concentrator photovoltaic module 2. As shown in FIG. 3, concentrator photovoltaic module 2 has a substrate 22 and concentrator photovoltaic elements 23.

Substrate 22 is disposed on the bottom surface of case 21. That is, substrate 22 is disposed on bottom plate 21b. A plurality of such substrates 22 may be disposed. The plurality of substrates 22 are disposed side by side in a direction perpendicular to the longitudinal direction of substrate 22. Preferably, the plurality of substrates 22 are connected in parallel. Each of substrates 22 is preferably an FPC substrate.

On substrate 22, the plurality of concentrator photovoltaic elements 23 are provided. On substrate 22, concentrator photovoltaic elements 23 are arranged side by side along the longitudinal direction of substrate 22. The plurality of concentrator photovoltaic elements 23 on substrate 22 are connected in parallel.

Figure 4:
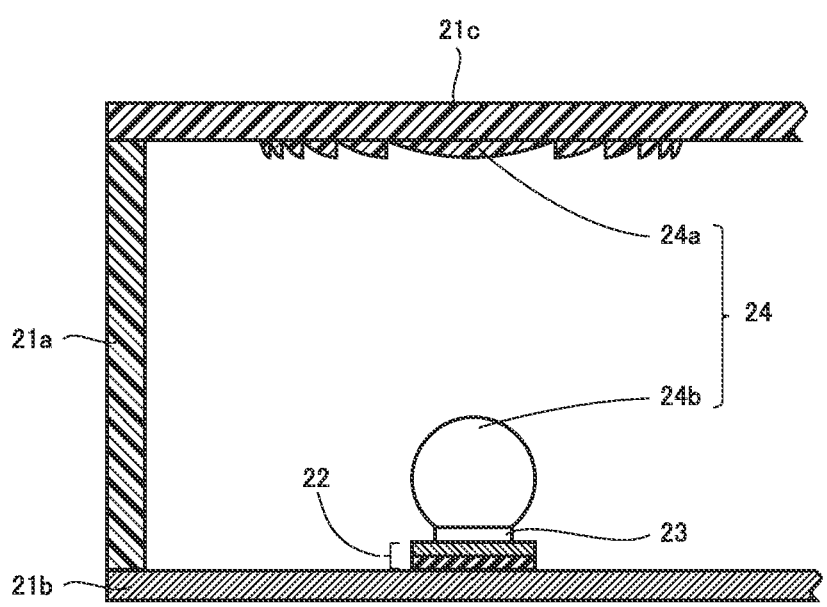
FIG. 4 is a cross sectional view taken along IV-IV in FIG. 3.

FIG. 4 is a cross sectional view taken along Iv-Iv of FIG. 3. As shown in FIG. 4, concentrator photovoltaic module 2 has an optical system 24. Optical system 24 has a primary optical system 24a and a secondary optical system 24b. Primary optical system 24a is provided on top plate 21c. Secondary optical system 24b is provided on concentrator photovoltaic element 23.

Primary optical system 24a collects sunlight on the secondary optical system. Primary optical system 24a is a Fresnel lens, for example. Secondary optical system 24b transmits, onto concentrator photovoltaic element 23, the sunlight collected by primary optical system 24a. Secondary optical system 24b is a sphere lens, for example.

Figure 5D:
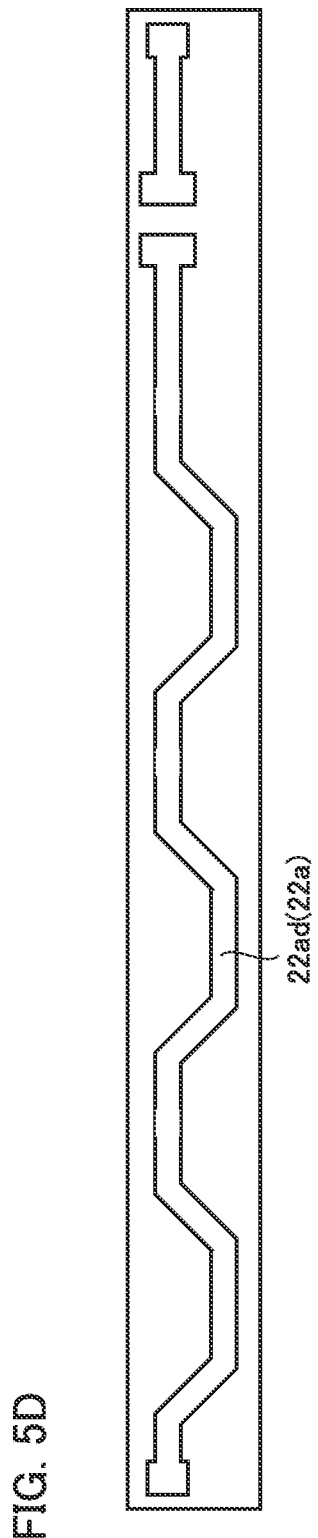
FIG. 5D is an enlarged top view in a fourth layer of substrate 22 of concentrator photovoltaic module 2 according to the embodiment from the uppermost layer thereof.

FIG. 5A is an enlarged top view of substrate 22 of concentrator photovoltaic module 2 according to the embodiment. FIG. 5B is an enlarged top view in a second layer of substrate 22 of concentrator photovoltaic module 2 according to the embodiment from the uppermost layer thereof. FIG. 5C is an enlarged top view in a third layer of substrate 22 of concentrator photovoltaic module 2 according to the embodiment from the uppermost layer thereof. FIG. 5D is an enlarged top view in a fourth layer of substrate 22 of concentrator photovoltaic module 2 according to the embodiment from the uppermost layer thereof. FIG. 5A to FIG. 5D respectively show top views of the layers of substrate 22. It should be noted that in FIG. 5A to FIG. 5D, in order to clarify structures of wiring layers 22a, illustrations of insulating layers 22b and adhesive layers 22c overlapping with and disposed above wiring layers 22a are omitted.

Figure 6:
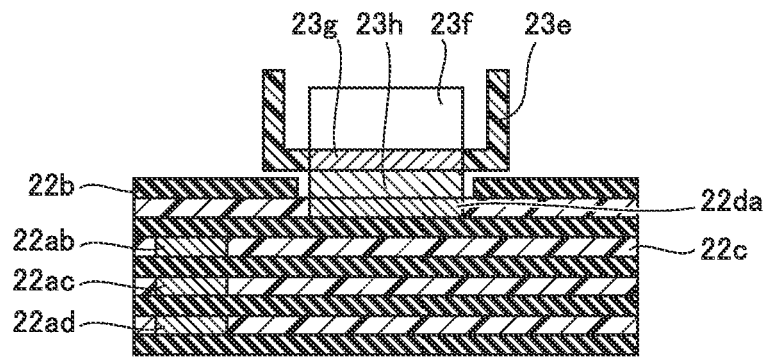
FIG. 6 is a cross sectional view taken along VI-VI of FIG. 5A.
Figure 7:
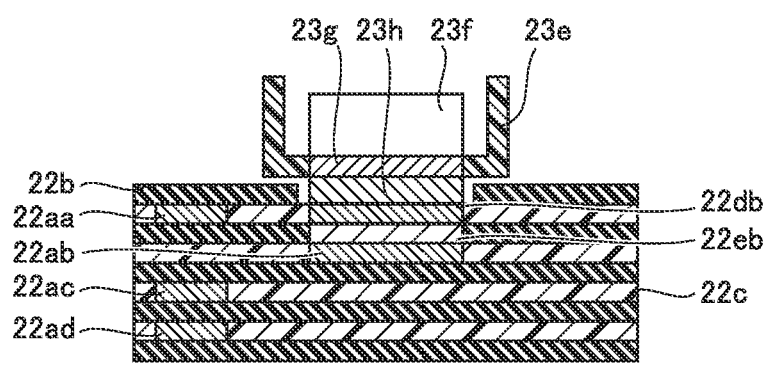
FIG. 7 is a cross sectional view taken along VII-VII of FIG. 5A.
Figure 8:
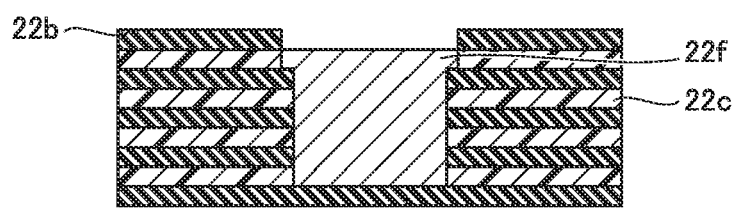
FIG. 8 is a cross sectional view taken along VIII-VIII of FIG. 5A.

FIG. 6 is a cross sectional view taken along VI-VI of FIG. 5A. FIG. 7 is a cross sectional view taken along VII-VII of FIG. 5A. FIG. 8 is a cross sectional view taken along VIII-VIII of FIG. 5A.

As shown in FIG. 5A to FIG. 5D, FIG. 6, FIG. 7, and FIG. 8, substrate 22 has wiring layers 22a, insulating layers 22b, adhesive layers 22c, land portions 22d, through-hole conductors 22e, and an end-portion through-hole conductor 22f.

For each of wiring layers 22a, a material with excellent thermal conductivity and excellent electric conductivity is used, such as copper (Cu). For each of insulating layers 22b, a material with an excellent insulating property is used, such as polyimide. For each of adhesive layers 22c, an epoxy-resin-based adhesive agent is used, for example.

Substrate 22 has the plurality of wiring layers 22a. As a specific example, the following describes a case where the number of wiring layers 22a is equal to the number of concentrator photovoltaic elements 23 disposed on substrate 22, i.e., a case where the number of concentrator photovoltaic elements 23 disposed on substrate 22 is 4 (these four concentrator photovoltaic elements 23 will be referred to as concentrator photovoltaic element 23a, concentrator photovoltaic element 23b, concentrator photovoltaic element 23c, and concentrator photovoltaic element 23d) and the number of wiring layers 22a is 4 (these wiring layer 22a will be referred to as wiring layer 22aa, wiring layer 22ab, wiring layer 22ac, and wiring layer 22ad).

It should be noted that: wiring layer 22aa is a wiring layer 22a located closest to the front surface side of substrate 22; wiring layer 22ab is a wiring layer 22a located second closest to the front surface side of substrate 22; wiring layer 22ac is a wiring layer 22a located third closest to the front surface side of substrate 22; and wiring layer 22ad is a wiring layer 22a located closest to the backside surface side of substrate 22.

In substrate 22, wiring layer 22aa, wiring layer 22ab, wiring layer 22ac, and wiring layer 22ad are stacked. Insulating layers 22b are provided between respective wiring layers 22a and on the front surface and backside surface of substrate 22. Adhesive layers 22c are provided between insulating layers 22b and wiring layers 22a.

The plurality of land portions 22d are provided in the layer provided with wiring layer 22aa in substrate 22. That is, in the layer provided with wiring layer 22aa in substrate 22, a land portion 22da, a land portion 22db, a land portion 22dc and a land portion 22dd are provided.

It should be noted that openings are provided in insulating layer 22b provided on the front surface of substrate 22, and adhesive layer 22c located just below insulating layer 22b provided on the front surface of substrate 22. From these openings, land portion 22da, land portion 22db, land portion 22dc and land portion 22dd are exposed.

Each of concentrator photovoltaic elements 23 has a package case 23e and an element body 23f. A package electrode 23g is provided at a bottom surface of package case 23e. Package electrode 23g is electrically connected to an element electrode provided at element body 23f by way of a solder, wire bonding, or the like.

Package electrodes 23g of concentrator photovoltaic elements 23 are connected to corresponding land portions 22d. More specifically, package electrode 23g of concentrator photovoltaic element 23a is connected to land portion 22da. Package electrode 23g of concentrator photovoltaic element 23b is connected to land portion 22db. Package electrode 23g of concentrator photovoltaic element 23c is connected to land portion 22dc. Package electrode 23g of concentrator photovoltaic element 23d is connected to land portion 22dd.

The connection between each package electrode 23g and each land portion 22d is made by a joining member 23h. Joining member 23h is a solder, for example.

Land portion 22da is connected to wiring layer 22aa. As a result, concentrator photovoltaic element 23a is connected to wiring layer 22aa. On the other hand, land portion 22db, land portion 22dc, and land portion 22dd are not connected to wiring layer 22aa.

The plurality of through-hole conductors 22e are provided in substrate 22. That is, in substrate 22, through-hole conductor 22eb, through-hole conductor 22ec, and through-hole conductor 22ed are provided. Each of through-hole conductors 22e is provided along a direction from the front surface of substrate 22 toward the backside surface of substrate 22. Through-hole conductor 22e is formed by providing a conductive layer such as a metal by way of plating on an inner circumferential surface of a through hole provided along the direction from the front surface of substrate 22 toward the backside surface of substrate 22. Through-hole conductor 22e may be formed by filling the inside of the through hole with a conductive layer such as a metal.

Through-hole conductor 22eb is connected to land portion 22db. Moreover, through-hole conductor 22eb extends from the layer provided with wiring layer 22aa to the layer provided with wiring layer 22ab, and is connected to wiring layer 22ab. Accordingly, land portion 22db and wiring layer 22ab are connected to each other. As a result, concentrator photovoltaic element 23b is connected to wiring layer 22ab.

Although not shown in the figures, in the same manner, land portion 22dc is connected to wiring layer 22ac via through-hole conductor 22ec extending from the layer provided with wiring layer 22a to the layer provided with wiring layer 22*ac*. In the same manner, land portion 22*dd* is connected to wiring layer 22*ad* via through-hole conductor 22*ed* extending from the layer provided with wiring layer 22*aa* to the layer provided with wiring layer 22*ad*.

As a result, concentrator photovoltaic element 23*c* is connected to wiring layer 22*ac*, and concentrator photovoltaic element 23*d* is connected to wiring layer 22*ad*.

End-portion through-hole conductor 22*f* is provided at the end portion of substrate 22. End-portion through-hole conductor 22*f* is provided along the direction from the front surface of substrate 22 toward the backside surface of substrate 22. End-portion through-hole conductor 22*f* is formed by providing a conductive layer such as a metal by way of plating on an inner circumferential surface of a through hole provided along the direction from the front surface of substrate 22 toward the backside surface of substrate 22. It should be noted that end-portion through-hole conductor 22*f* may be formed by filling the inside of the through hole with a conductive layer such as a metal. Accordingly, in end-portion through-hole conductor 22*f*, a cross sectional area of the wiring in a direction perpendicular to a direction in which current flows is wide.

End-portion through-hole conductor 22*f* extends from the layer provided with wiring layer 22*aa* to the layer provided with wiring layer 22*ad*, and is connected to wiring layer 22*aa*, wiring layer 22*ab*, wiring layer 22*ac*, and wiring layer 22*ad*. It should be noted that end-portion through-hole conductor 22*f* is electrically connected to an end-portion through-hole conductor 22*f* of another substrate 22.

Figure 9:
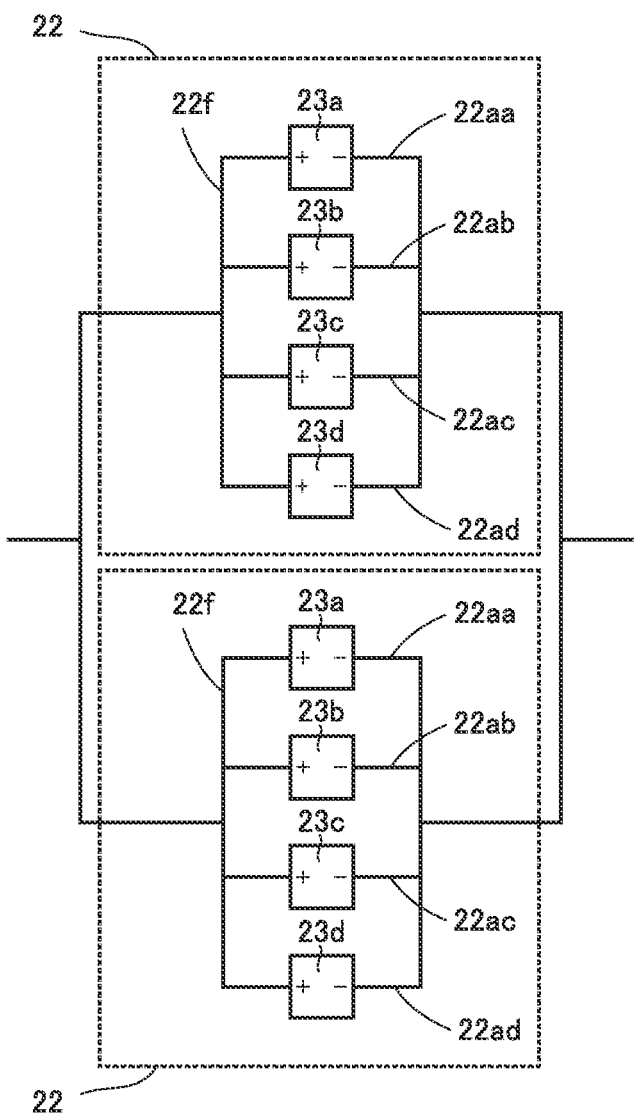
FIG. 9 is a schematic view showing a manner of connection in concentrator photovoltaic module 2 according to the embodiment.

FIG. 9 is a schematic view showing a manner of connection in concentrator photovoltaic module 2 according to the embodiment. As described above, concentrator photovoltaic element 23*a* is connected to wiring layer 22*aa*, concentrator photovoltaic element 23*b* is connected to wiring layer 22*ab*, concentrator photovoltaic element 23*c* is connected to wiring layer 22*ac*, concentrator photovoltaic element 23*d* is connected to wiring layer 22*ad*, and wiring layer 22*aa*, wiring layer 22*ab*, wiring layer 22*ac*, and wiring layer 22*ad* are connected to one another via end-portion through-hole conductor 22*f*.

Accordingly, as shown in FIG. 9, the plurality of concentrator photovoltaic elements 23 are connected in parallel on substrate 22. That is, concentrator photovoltaic elements 23 connected to different wiring layers 22*a* are connected to each other in parallel.

Moreover, as described above, end-portion through-hole conductor 22*f* is connected to end-portion through-hole conductor 22*f* provided in another substrate 22. Accordingly, concentrator photovoltaic elements 23 on a certain substrate 22 are also connected to concentrator photovoltaic elements 23 on another substrate 22 in parallel.

Figure 10:
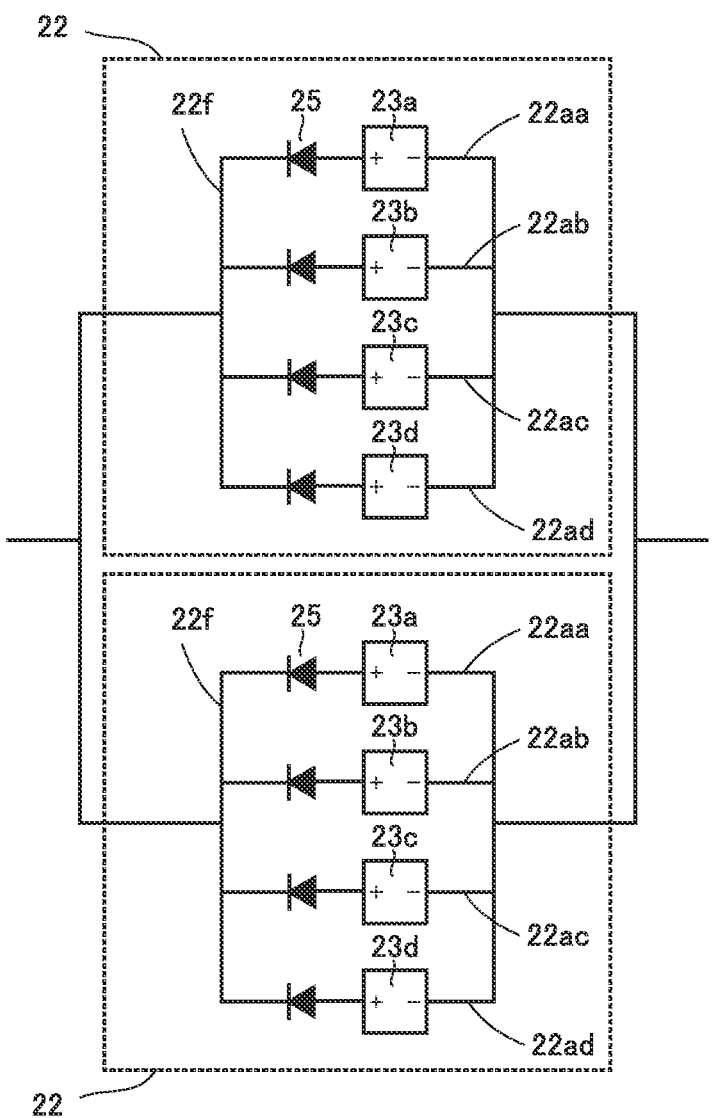
FIG. 10 is a schematic view showing a manner of connection in concentrator photovoltaic module 2 according to a first modification of the embodiment.

Configuration of Concentrator Photovoltaic Module According to First Modification of Embodiment FIG. 10 is a schematic view showing a manner of connection in concentrator photovoltaic module 2 according to a first modification of the embodiment. As shown in FIG. 10, concentrator photovoltaic module 2 according to the first modification of the embodiment further includes a reverse current preventing unit 25.

Reverse current preventing unit 25 permits passage of current in a direction from concentrator photovoltaic element 23 toward reverse current preventing unit 25, but blocks current in a direction from reverse current preventing unit 25 toward concentrator photovoltaic element 23. Reverse current preventing unit 25 is a diode, for example.

In this case, the diode has an anode connected to the positive package electrode of concentrator photovoltaic element 23. Reverse current preventing unit 25 is connected to concentrator photovoltaic element 23 in series.

Reverse current preventing unit 25 is provided for each concentrator photovoltaic element 23. That is, reverse current preventing units 25 are similarly connected to concentrator photovoltaic element 23*b*, concentrator photovoltaic element 23*c*, and concentrator photovoltaic element 23*d* in series, respectively.

Figure 11:
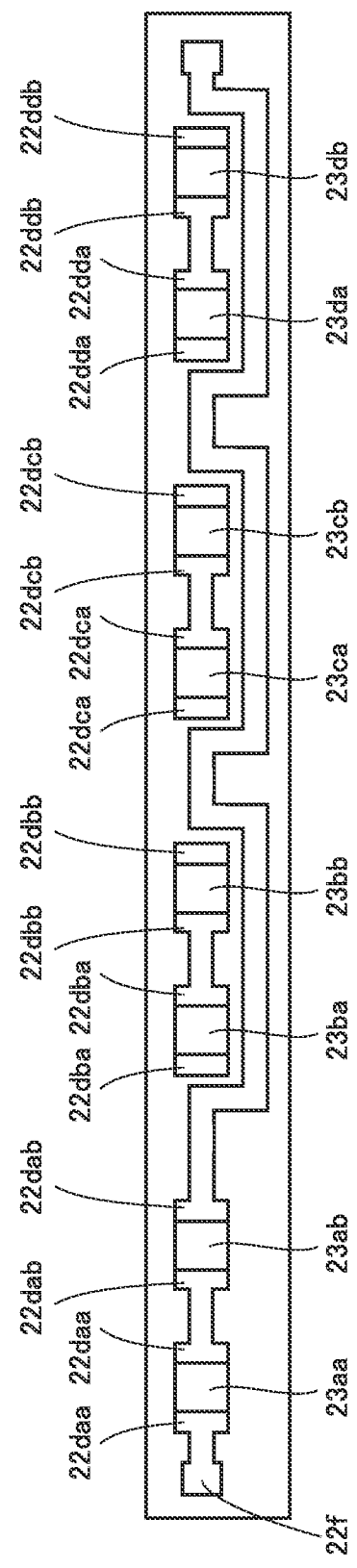
FIG. 11 is an enlarged top view of a substrate 22 of a concentrator photovoltaic module 2 according to a second modification of the embodiment.

Configuration of Concentrator Photovoltaic Module According to Second Modification of Embodiment FIG. 11 is an enlarged top view of substrate 22 of concentrator photovoltaic module 2 according to a second modification of the embodiment. As shown in FIG. 11, land portion 22*da* of substrate 22 of concentrator photovoltaic module 2 according to the second modification of the embodiment has a land portion 22*daa* and a land portion 22*dab*.

One side of land portion 22*daa* is connected to wiring layer 22*aa*. The other side of land portion 22*daa* is connected to one side of land portion 22*dab*. The other side of land portion 22*dab* is connected to wiring layer 22*aa*.

Although not shown, one side of land portion 22*dba* is connected to wiring layer 22*ab* via through-hole conductor 22*eb*. The other side of land portion 22*dba* is connected to one side of land portion 22*dbb*. The other side of land portion 22*dbb* is connected to wiring layer 22*ab* via through-hole conductor 22*eb*.

Similarly, one side of land portion 22*dca* is connected to wiring layer 22*ac* via through-hole conductor 22*ec*. The other side of land portion 22*dca* is connected to one side of land portion 22*dcb*. The other side of land portion 22*dcb* is connected to wiring layer 22*ac* via through-hole conductor 22*ec*.

Similarly, one side of land portion 22*dda* is connected to wiring layer 22*ad* via through-hole conductor 22*ed*. The other side of land portion 22*dda* is connected to one side of land portion 22*ddb*. The other side of land portion 22*ddb* is connected to wiring layer 22*ad* via through-hole conductor 22*ed*.

Package electrode 23*g* of concentrator photovoltaic element 23*aa* is connected to land portion 22*daa*. Package electrode 23*g* of concentrator photovoltaic element 23*ab* is connected to land portion 22*dab*. That is, concentrator photovoltaic element 23*aa* and concentrator photovoltaic element 23*ab* connected to the same wiring layer 22*a* are connected to each other in series.

The same applies to other wiring layers 22*a*. That is, concentrator photovoltaic element 23*ba* and concentrator photovoltaic element 23*bb* connected to wiring layer 22*ab* are connected to each other in series, concentrator photovoltaic element 23*ca* and concentrator photovoltaic element 23*cb* connected to wiring layer 22*ac* are connected to each other in series, and concentrator photovoltaic element 23*da* and concentrator photovoltaic element 23*db* connected to wiring layer 22*ad* are connected to each other in series.

As described above, in the second modification of the embodiment, concentrator photovoltaic elements 23 connected to different wiring layers 22*a* are connected to each other in parallel, and concentrator photovoltaic elements 23 connected to the same wiring layer 22*a* are connected to each other in series.

Configuration of Hydrogen Generating System According to Embodiment

Figure 12:
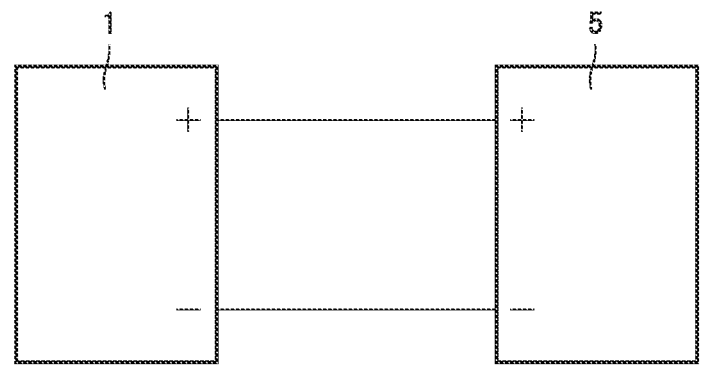
FIG. 12 is a schematic view of a hydrogen generating system according to the embodiment.

FIG. 12 is a schematic view of a hydrogen generating system according to the embodiment. As shown in FIG. 12, the hydrogen generating system according to the embodiment has concentrator photovoltaic device 1 according to the embodiment, and a hydrogen generating device 5. The output of concentrator photovoltaic device 1 is connected to hydrogen generating device 5. Accordingly, electric power generated in concentrator photovoltaic device 1 is supplied to hydrogen generating device 5.

Figure 13:
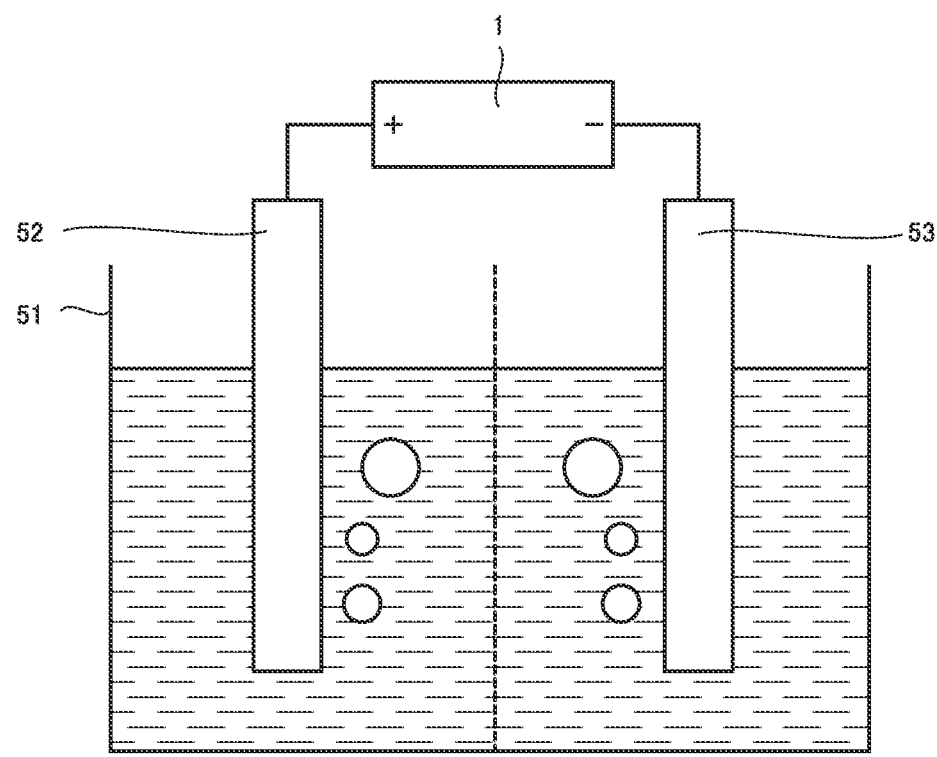
FIG. 13 is a schematic view of a hydrogen generating device 5 in the hydrogen generating system according to the embodiment.

FIG. 13 is a schematic view of hydrogen generating device 5 in the hydrogen generating system according to the embodiment. As shown in FIG. 13, hydrogen generating device 5 has a reservoir 51, a positive electrode 52, and a negative electrode 53. Water to be electrolyzed is stored in reservoir 51. Positive electrode 52 and negative electrode 53 are immersed in the water stored in reservoir 51. Positive electrode 52 and negative electrode 53 are connected to the output of concentrator photovoltaic device 1.

Electric power is supplied from concentrator photovoltaic device 1 to hydrogen generating device 5, whereby the water is electrolyzed in positive electrode 52 and negative electrode 53. As a result, hydrogen is generated from the negative electrode, and oxygen is generated from the positive electrode.

Figure 14:
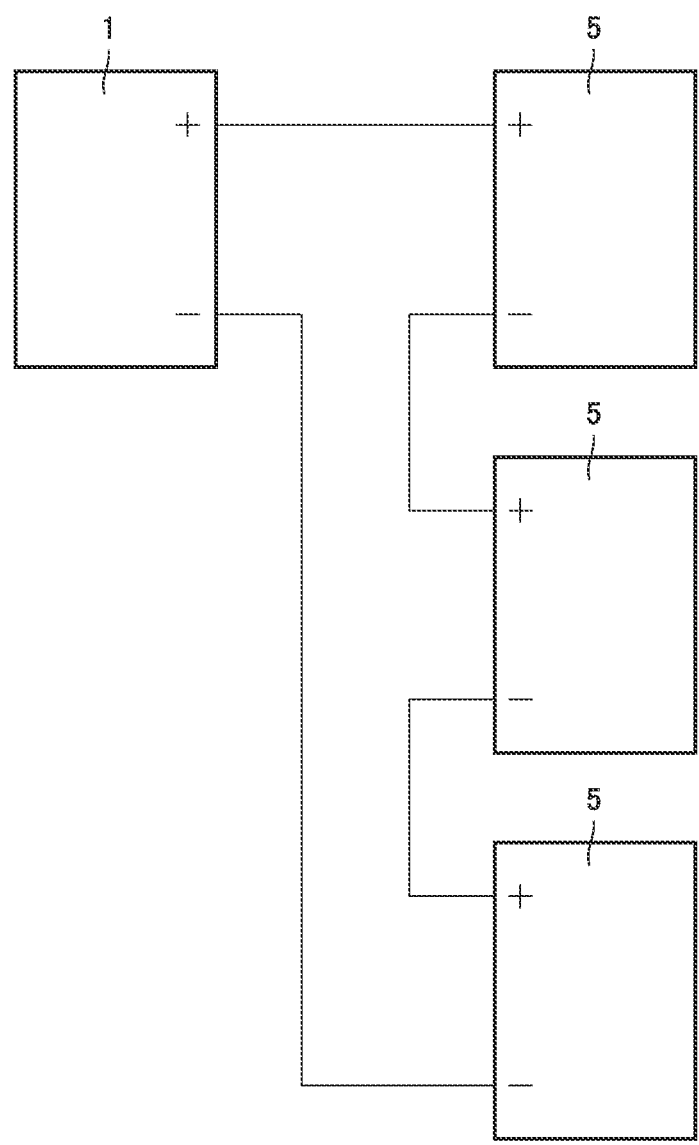
FIG. 14 is a schematic view showing a manner of connection between hydrogen generating devices 5 and concentrator photovoltaic device 1 in the hydrogen generating system according to the embodiment.

FIG. 14 is a schematic view showing a manner of connection between hydrogen generating devices 5 and concentrator photovoltaic device 1 in the hydrogen generating system according to the embodiment. As shown in FIG. 14, the plurality of hydrogen generating devices 5 may be connected to concentrator photovoltaic device 1 in series.

Preferably, concentrator photovoltaic device 1 and hydrogen generating devices 5 are connected to each other such that voltage decreased by hydrogen generating devices 5 connected in series becomes more than or equal to 80% with respect to the output voltage of concentrator photovoltaic device 1.

For example, voltage decreased by a hydrogen generating device 5 is of about 1.7 V. Therefore, voltage decreased when five hydrogen generating devices 5 are connected in series is of about 8.5 V. On the other hand, the output voltage of one concentrator photovoltaic element 23 is of about 3.0 V.

Therefore, the output voltage of concentrator photovoltaic device 1 becomes about 9.0 V when nine concentrator photovoltaic elements 23 are provided on substrate 22, three wiring layers 22a are provided, and three concentrator photovoltaic elements 23 are connected in series for each wiring layer 22a. Therefore, the above-described ratio is attained in this example.

Effect of Concentrator Photovoltaic Module, Concentrator Photovoltaic Device, and Hydrogen Generating System According to Embodiment The following describes an effect of concentrator photovoltaic module 2 according to the embodiment.

When the plurality of concentrator photovoltaic elements 23 are connected in parallel without using multiple wiring layers 22a unlike concentrator photovoltaic module 2 according to the embodiment, a wiring space is limited. Accordingly, a degree of freedom in wiring design is limited extremely. Furthermore, a wiring width has to be narrow in this case. Such a narrow wiring width leads to increased wiring resistance to result in a problem of heat generation.

On the other hand, in the concentrator photovoltaic module according to the embodiment, substrate 22 has the plurality of wiring layers 22a. Hence, according to concentrator photovoltaic module 2 according to the embodiment, the output voltage can be decreased while suppressing increase of wiring resistance without limiting the degree of freedom in wiring design.

In concentrator photovoltaic module 2 according to the embodiment, since the plurality of concentrator photovoltaic elements 23 are connected in parallel, it is necessary to consider a problem of reverse current. When concentrator photovoltaic module 2 according to the embodiment has reverse current preventing units 25 connected to concentrator photovoltaic elements 23 in series, the output voltage can be decreased while preventing occurrence of reverse current.

In concentrator photovoltaic module 2 according to the embodiment, when concentrator photovoltaic elements 23 connected to the same wiring layer 22a are connected to each other in series, the output voltage can be accordingly adjusted. That is, the output voltage can be optimized in accordance with a requirement specification of the device (for example, hydrogen generating device 5) connected to concentrator photovoltaic device 1.

In concentrator photovoltaic module 2 according to the embodiment, a large amount of current flows at a portion at which the plurality of wiring layers 22a are connected to each other. When concentrator photovoltaic module 2 according to the embodiment has end-portion through-hole conductor 22f, a cross-sectional area of the wiring is increased at the portion at which the plurality of wiring layers 22a are connected to each other, thereby suppressing the problem of generation of heat caused by flow of a large amount of current.

In concentrator photovoltaic module 2 according to the embodiment, in the case where the plurality of substrates 22 are provided and are connected to each other in parallel, the output voltage can be decreased even when the number of concentrator photovoltaic elements 23 mounted thereon is increased.

The following describes an effect of concentrator photovoltaic device 1 according to the embodiment.

Since concentrator photovoltaic device 1 according to the embodiment has the concentrator photovoltaic module according to the embodiment, the above-described effect is also exhibited.

The following describes an effect of the hydrogen generating system according to the embodiment.

If the output voltage of concentrator photovoltaic device 1 is high unlike the hydrogen generating system according to the embodiment, the voltage decreased by hydrogen generating devices 5 becomes lower than the output voltage of concentrator photovoltaic device 1. Accordingly, in order to avoid electric power loss, it is necessary to connect an extremely large number of hydrogen generating devices 5 in series.

On the other hand, in the hydrogen generating system according to the embodiment, since the output voltage of concentrator photovoltaic device 1 is low, it is not necessary to connect a large number of hydrogen generating devices 5 in series. That is, in the hydrogen generating system according to the embodiment, the electric power loss can be readily addressed by increasing surface areas of positive electrode 52 and negative electrode 53 of hydrogen generating device 5 in accordance with the output current increased due to the decrease of the output voltage of concentrator photovoltaic device 1.

In the hydrogen generation system according to the embodiment, when the voltage decreased by hydrogen generating devices 5 connected in series is more than or equal to 80% with respect to the output voltage of concentrator photovoltaic device 1, electric power generated in concentrator photovoltaic device 1 can be suppressed from being lost.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: concentrator photovoltaic device; 2: concentrator photovoltaic module; 21: case; 21a: frame body; 21b: bottom plate; 21c: top plate; 22: substrate; 22a, 22aa, 22ab, 22ad: wiring layer; 22b: insulating layer; 22c: adhesive layer; 22d, 22da, 22daa, 22dab, 22db, 22dba, 22dbb, 22dc, 22dca, 22dcb, 22dd, 22dda, 22ddb: land portion; 22e, 22eb, 22ec, 22ed: through-hole conductor; 22f: end-portion through-hole conductor; 23, 23a, 23aa, 23ab, 23b, 23ba, 23bb, 23c, 23ca, 23cb, 23d, 23da, 23db: concentrator photovoltaic element; 23e: package case; 23f: element body; 23g: package electrode; 23h: joining member; 24: optical system; 24a: primary optical system; 24b: secondary optical system; 25: reverse current preventing unit; 3: frame; 4: platform; 5: hydrogen generating device; 51: reservoir; 52: positive electrode; 53: negative electrode.

The invention claimed is:

1. A concentrator photovoltaic module comprising:
a case;
a substrate disposed on a bottom surface of the case and having a plurality of stacked wiring layers; and
a plurality of concentrator photovoltaic elements disposed on the substrate and connected to the wiring layers, wherein
each of the concentrator photovoltaic elements is connected to a different stacked wiring layer of the plurality of stacked wiring layers, and
each of the concentrator photovoltaic elements is connected to each other in parallel.

2. The concentrator photovoltaic module according to claim 1, further comprising a reverse current preventing unit connected to each of the concentrator photovoltaic elements in series, wherein
the reverse current preventing unit is configured to permit passage of current in a direction from the concentrator photovoltaic element toward the reverse current preventing unit, and is configured to block current in a direction from the reverse current preventing unit toward the concentrator photovoltaic element.

3. The concentrator photovoltaic module according to claim 1, further comprising a second concentrator photovoltaic element connected to one of the stacked wiring layers,
wherein the second concentrator photovoltaic element and one of the concentrator photovoltaic elements are connected to the same stacked wiring layer and are connected to each other in series.

4. The concentrator photovoltaic module according to claim 1, wherein the substrate has an end-portion through-hole conductor disposed at an end portion of the substrate and connected to the plurality of wiring layers.

5. The concentrator photovoltaic module according to claim 1, wherein
a plurality of the substrates are provided, and
the plurality of the substrates are connected to each other in parallel.

6. A concentrator photovoltaic device comprising the concentrator photovoltaic module recited in claim 1.

7. A hydrogen generating system comprising:
the concentrator photovoltaic device recited in claim 6; and
a plurality of hydrogen generating devices configured to generate hydrogen using electric power supplied from the concentrator photovoltaic device, wherein
the plurality of hydrogen generating devices are connected to each other in series, and
a ratio of voltage decreased by the plurality of hydrogen generating devices to output voltage of the concentrator photovoltaic device is more than or equal to 80%.

* * * * *